United States Patent [19]

Nigro, Jr. et al.

[11] Patent Number: 4,742,478
[45] Date of Patent: May 3, 1988

[54] HOUSING FOR A PORTABLE COMPUTER

[75] Inventors: Arthur R. Nigro, Jr., Hopkinton; Marcel Boudreau, Warren, both of Mass.

[73] Assignee: Data General Corporation, Westboro, Mass.

[21] Appl. No.: 652,219

[22] Filed: Sep. 19, 1984

[51] Int. Cl.⁴ .......................... G06F 1/00; H05K 5/00; A47B 21/00
[52] U.S. Cl. .................................. 364/708; 361/394; 312/208
[58] Field of Search ................ 364/708; 361/397, 401, 361/412, 415, 417, 394; 312/208; 379/96; 248/166, 371, 649, 677

[56] References Cited

U.S. PATENT DOCUMENTS

| D. 245,024 | 7/1977 | Genin | 364/708 |
|---|---|---|---|
| 3,962,608 | 6/1976 | Forster et al. | 361/415 |
| 4,490,604 | 12/1984 | Read et al. | 312/208 X |
| 4,496,943 | 1/1985 | Greenblatt | 364/708 |
| 4,497,036 | 1/1985 | Dunn | 364/708 |
| 4,524,940 | 6/1985 | Yurchenco et al. | 248/371 |
| 4,556,189 | 12/1985 | Kirpluk et al. | 248/371 |
| 4,571,456 | 2/1986 | Paulsen et al. | 379/96 |
| 4,589,659 | 5/1986 | Yokol et al. | 364/708 |
| 4,617,640 | 10/1986 | Kishi et al. | 364/708 |

OTHER PUBLICATIONS

IBM Technical Disclosure Bulletin, vol. 28, No. 6, Nov. 1985, *Keyboard Support Lifting Assembly with Locking Feature*, pp. 2361-2363.

*Primary Examiner*—Gary V. Harkcom
*Assistant Examiner*—Long Thanh Nguyen
*Attorney, Agent, or Firm*—Jacob Frank; Joel Wall; Irving M. Kriegsman

[57] ABSTRACT

A portable computer is sized to fit into a businessman's attache case and may be seated on a surface for use in either a normal position or a tilted forward position. The portable computer includes a housing having a base, a front top cover, a rear top cover and a foot door. The front top cover is pivotally attached to the front of the rear top cover and the rear top cover is fixedly attached to the base. Computer electronics (i.e. printed circuit boards), and two floppy disk drives are mounted inside the housing on the base at the rear and a full size keyboard is mounted inside the housing on the base at the front. A battery pack is disposed in the rear top cover of the housing. A full size liquid crystal display monitor is mounted on the front top cover. The foot door is movably mounted on the back of the base. When the front top cover is pivoted open the display screen is viewable and the keyboard is accessible. When the foot door is in a closed position the keys on the keyboard are at the optimum angle for typing with the portable computer resting on the lap of a user and when the foot door is in an open position the keys on the keyboard are at the optimum angle for typing with the portable computer resting on a desk or table and tilted forward.

16 Claims, 7 Drawing Sheets

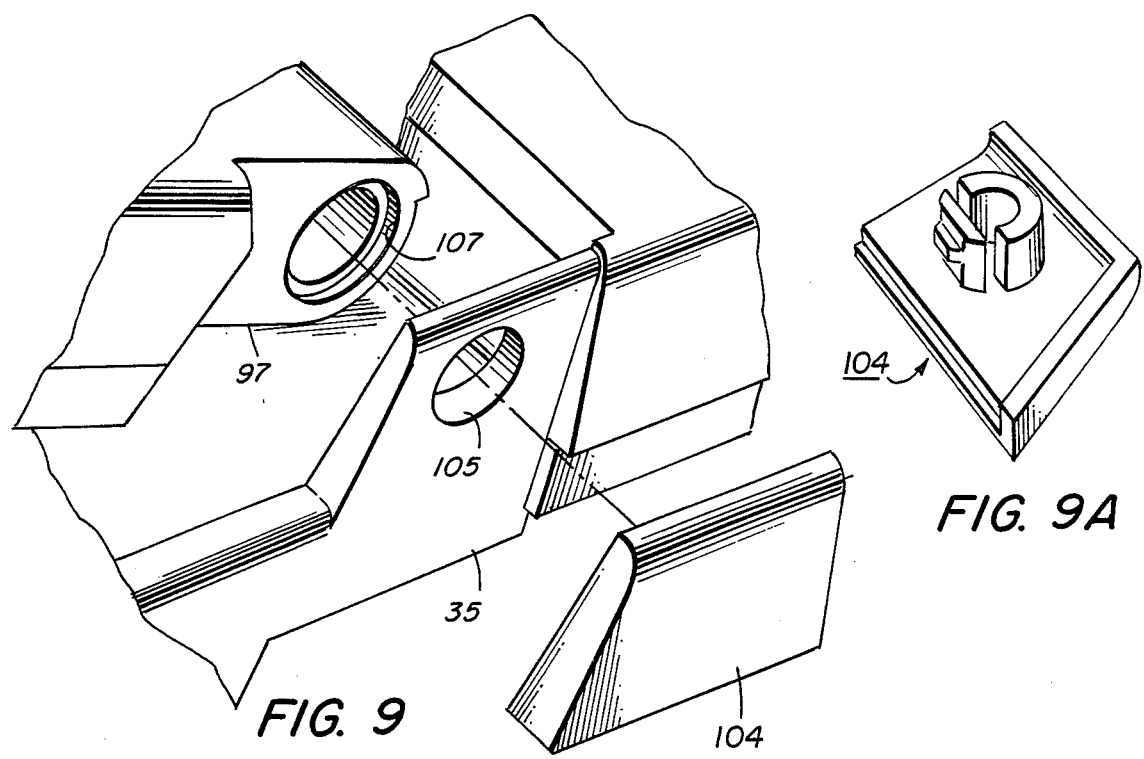
FIG. 9
FIG. 9A
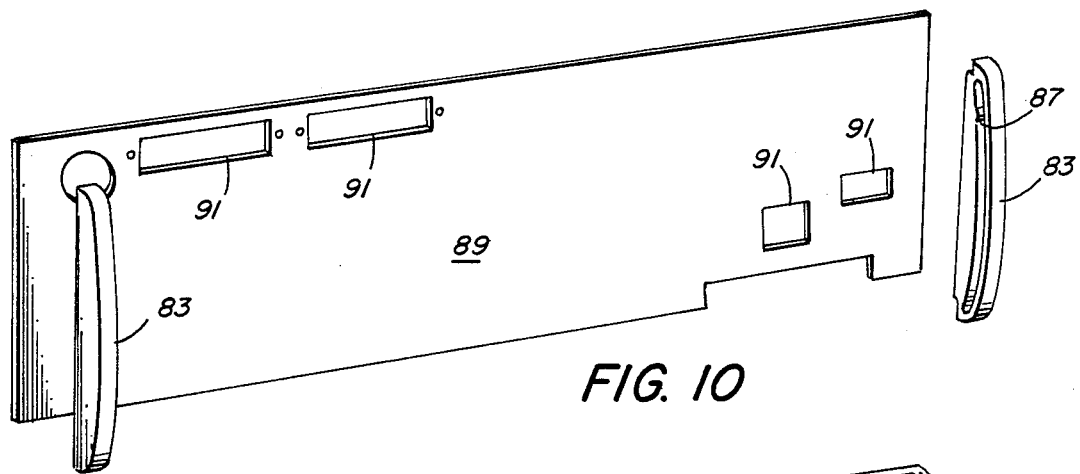
FIG. 10
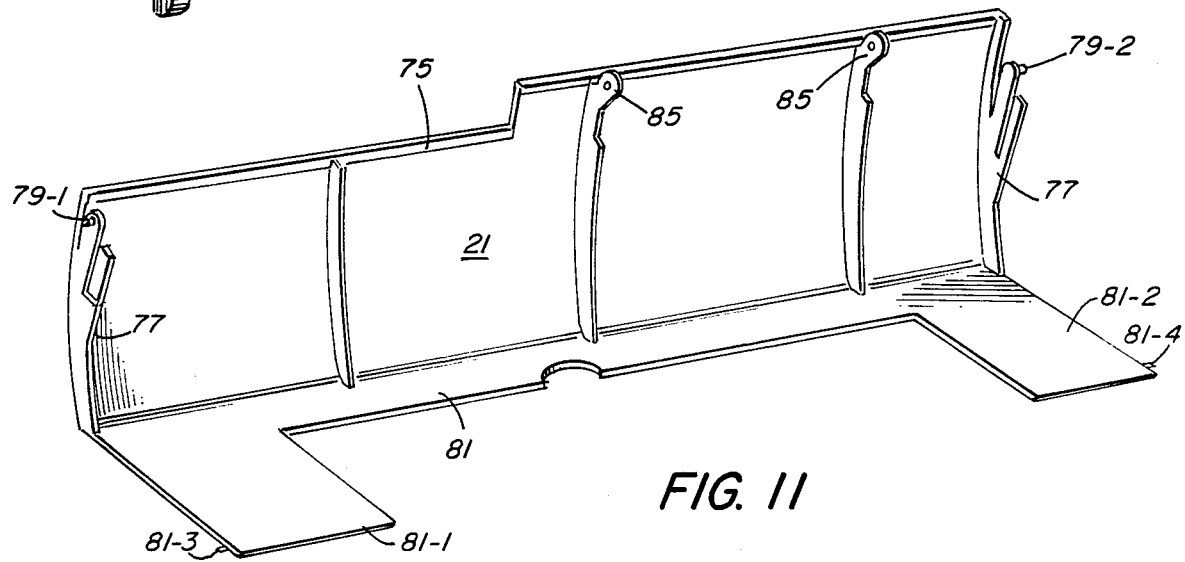
FIG. 11

HOUSING FOR A PORTABLE COMPUTER

BACKGROUND OF THE INVENTION

The present invention relates generally to computers and more particularly to portable computers.

Computers which have been referred to in the past as being portable are known in the art. However, it is believed that such computers have either (1) not included a built-in display monitor, or (2) not included a display monitor having a full size display screen, or (3) contained only a single disk drive unit, or (4) not included a built-in keyboard, or (5) not included a full size keyboard, or (6) not taken into consideration that the optimum angle of the keyboard for typing when the keyboard is resting on the lap of a user is not the same as the optimum angle of the keyboard for typing when the keyboard is resting on a table top or desk top, or (7) not contained its own power source, or (8) not contructed or shaped so that they can actually fit into an attache case, or (a) not easily and conveniently moved from one location to another.

Accordingly, it is an object of this invention to provide a new and improved computer.

It is another object of this invention to provide a new and improved portable computer.

It is still another object of this invention to provide a portable computer that is easy and convenient to carry from one location to another.

It is yet still another object of this invention to provide a portable computer that can fit into a businessman's attache case.

It is a further object of the invention to provide a portable computer that includes a full size (i.e. 80 columns by 25 lines) display monitor.

It is another object of the invention to provide a portable computer that includes a full size (i.e. DIN spaced) keyboard.

It is still another object of the invention to provide a portable computer that includes two disc drive units.

It is yet still another object of the invention to provide a portable computer that includes its own power source.

It is a further object of the invention to provide a portable computer that can be seated on a surface at either of one of two angular positions relative to the user.

It is still a further object of the invention to provide a portable computer which includes a housing having a minimum number of parts.

It is yet still a further object of the invention to provide a portable computer which can easily assembled and mass produced.

BRIEF DESCRIPTION OF THE DRAWINGS

In the drawings wherein like reference numerals represent like parts:

FIG. 8A is an enlarged perspective view of one of the spring clips shown in FIG. 8;

FIG. 9 is an enlarged perspective view of a portion of the portable computer shown in FIG. 1 where the front top cover and the rear top cover of the housing are hingedly connected.

FIG. 9A is an enlarged perspective view of the pivot pin shown in FIG. 9;

FIG. 10 is an enlarged perspective view of the bulkhead and channel elements shown in FIG. 6; and FIG. 11 is an enlarged perspective view of the foot door shown in FIG. 3.

SUMMARY OF THE INVENTION

Figure 1:
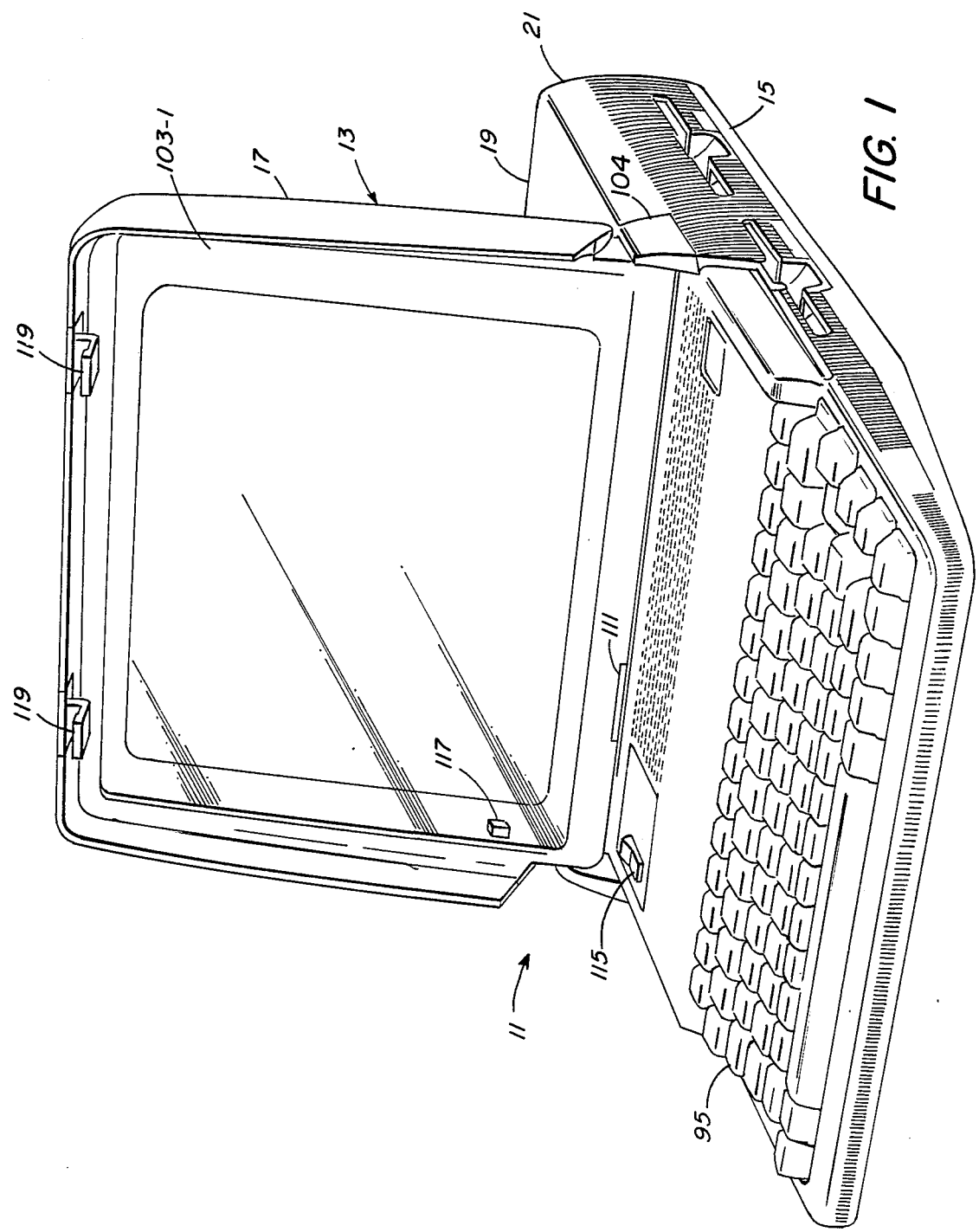
FIG. 1 is a perspective view taken from the front of a portable computer constructed according to the teachings of the present invention with the front top cover containing the display screen in an open position and the foot door at the rear of the portable computer in a closed position.

A portable computer constructed according to the teachings of the present invention comprises a housing adapted to rest on a surface and including means for adjusting the angular position at which the housing is disposed on said surface so that the housing may be seated thereon in either a normal or a tilted forward position, computer electronics in said housing, a power source in said housing, disk drive means in said housing, a keyboard in said housing and a display monitor in said housing. The means for adjusting the angle at which the housing is disposed on the surface enables the keys on the keyboard to be oriented at the optimum angle for use at one position relative to the user when the portable computer is resting on one surface, such as the lap of the user, and to be oriented at the optimum angle for use at another position relative to the user when the portable computer is resting on another surface, such as a desk or table.

Various features and advantages will appear from the description to follow. In the description, reference is made to the accompanying drawing which forms a part thereof, and in which is shown by way of illustration, a specific embodiment for practicing the invention. This embodiment will be described in sufficient detail to enable those skilled in the art to practice the invention, and it is to be understood that other embodiments may be made without departing from the scope of the invention. The following detailed description is, therefore, not to be taken in a limiting sense, and the scope of the present invention is best defined by the appended claims.

DETAILED DESCRIPTION OF THE PREFERRED EMBODIMENT

Referring now to the drawings, there is illustrated in the drawings a portable computer constructed according to the teachings of the present invention and identified generally by reference numeral 11.

Portable computer 11 includes a generally rectangular wedge shaped housing 13.

Housing 13 includes a base 15, a front top cover 17, a rear top cover 19 and a foot door 21. Front top cover 17 extends over the front of base 15 while rear top cover 19 extends over the rear of base 15.

Base 15, which is a unitary structure and made of molded plastic, includes a generally rectangular bottom wall 23, a left side wall 25 and a right side wall 27. Bottom wall 23 includes a generally flat back section 23-1 and a generally flat front section 23-2. Front section 23-2 is angled relative to back seciton 23-1 at an angle α of about ten degrees. A center rib 29 which provides support for base 15 extends along the top surface of bottom wall 23 and a transverse rib 31 which provides support for base 15 and also serves as a divider and a mount for some of the printed circuit boards inside portable computer 11 extends at right angles to center rib 29 along the top surface of bottom wall 23.

Rear top cover 19, which is a unitary structure and is made of molded plastic, includes a generally rectangular stepped top wall 33 having a rear section 33-1 and a front section 33-2 which is lower than the rear section, a left side wall 35, a right side wall 37, a back wall 39, a front wall 41 and a recessed portion which defines a battery compartment 43. A removable battery compartment cover 45 is slidably mounted on front top cover 17.

Rear top cover 19 is secured to base 15 by three screws 47 which extend up from the bottom through three bosses 49, 51, and 53 in base 15 into three threaded bosses 55, 57, and 59 in top cover 19 and six spring clips 61 which snap fit into rectangular slots 63 formed in the side walls of rear top cover 19 and base 15 three on each side. When rear top cover 19 is secured to base 15, the bottom edge of left side wall 35 and right side wall 37 of top rear cover 19 is seated on the top edge of left side wall 25 and right side wall 27 of base 15, with the space between base 15 and rear top cover 19 defining a chamber or cavity which extends from the back of housing 13 to front section 23-2 of bottom wall 23. Thus, rear top cover 19 serves as a cover only for the rear portion of base 15.

The electronics portion of portable computer 11 (i.e. printed circuit boards etc.) shown synbolically as boxes 65 and 66 and 67 disposed in the left and right rear portions of the housing chamber while first and second disk drive units, shown symbollically as boxes 68 and 69, are disposed in the right portion of the housing chamber.

As can be seen, right side wall 27 of base 15 is configured to provide slots 71 and 73 through which disks may be inserted and loaded into disk drive units 68 and 69.

Foot door 21, which is a unitary structure and is made of molded plastic, includes a generally rectangular, slightly curved back wall 75, a pair of side sections 77 having guide pins 79-1 and 79-2 and a bottom wall 81 having legs 81-1 and 81-2 which include guide pins 81-3 and 81-4.

A pair of arcuate shaped channel elements 83 are seated in slots 85 formed in side wall 25 and 27 of base 15, one at each end corner.

Figure 2:
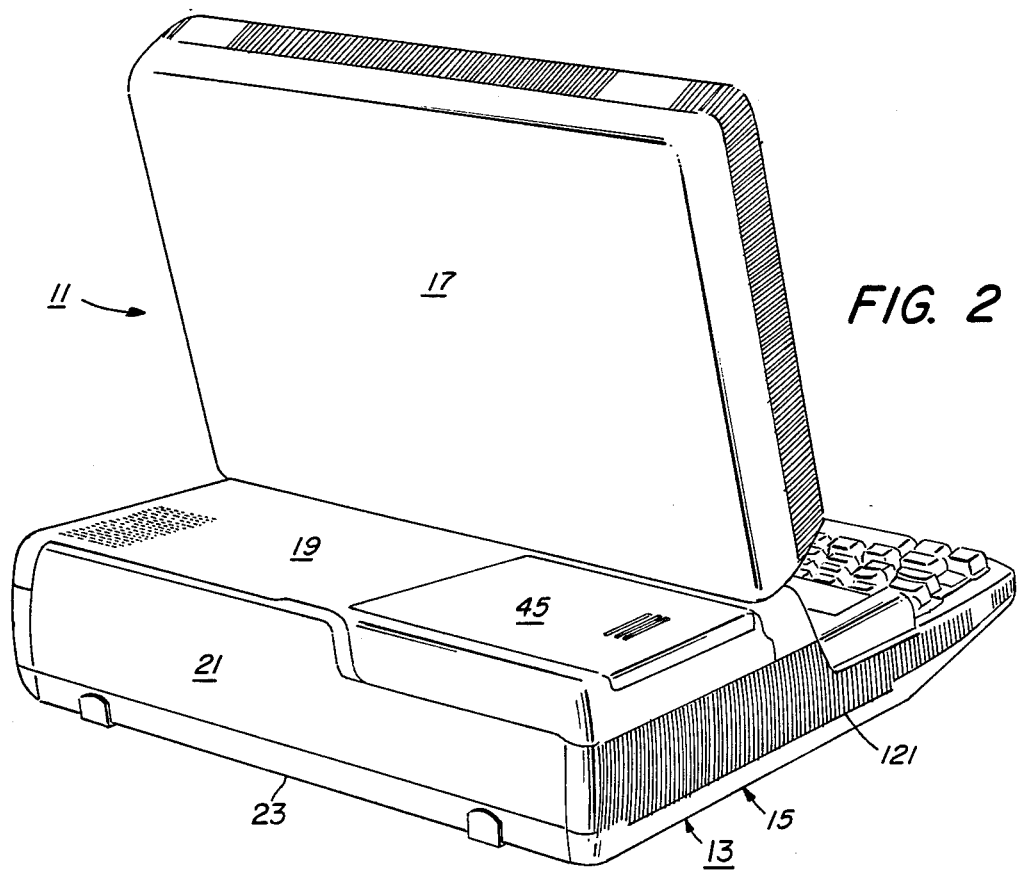
FIG. 2 is a perspective view taken from the back of the portable computer shown in FIG. 1.
Figure 3:
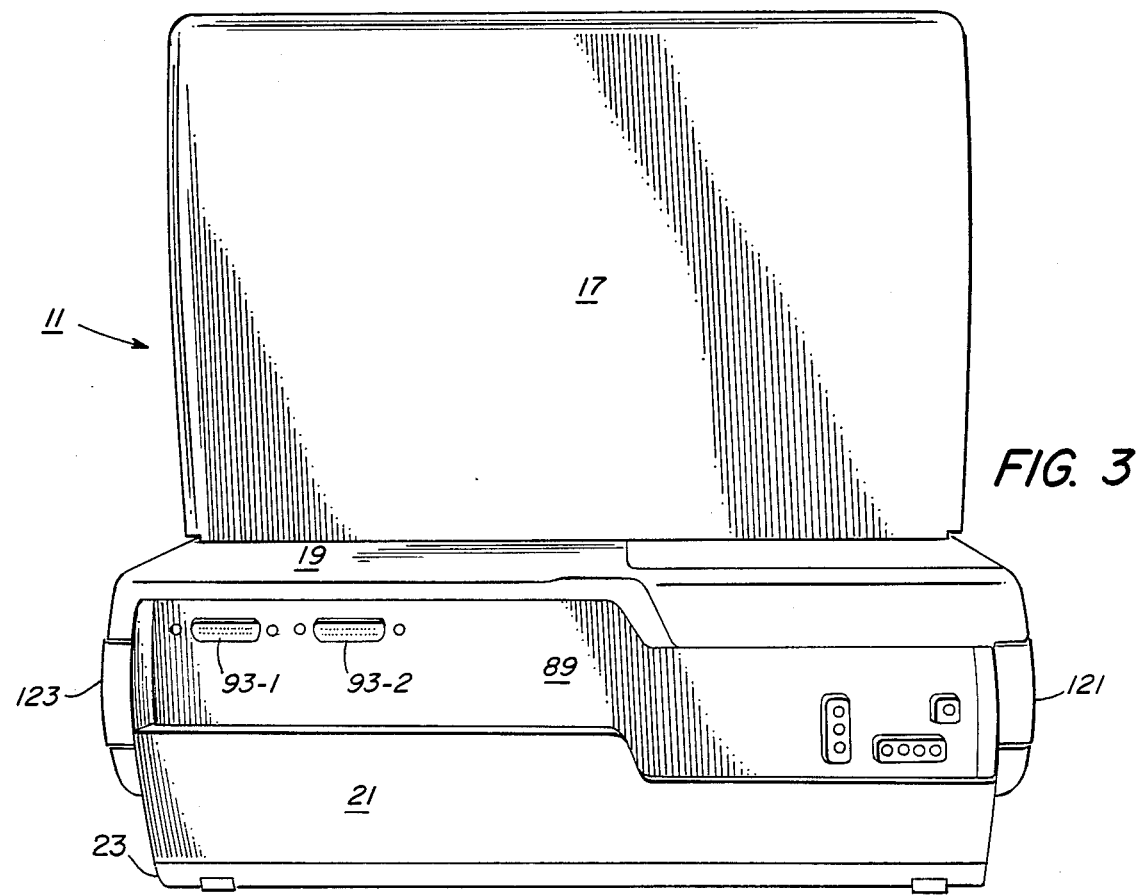
FIG. 3 is a back elevation view of the portable computer shown in FIG. 1, but with the foot door in an open position.
Figure 5:
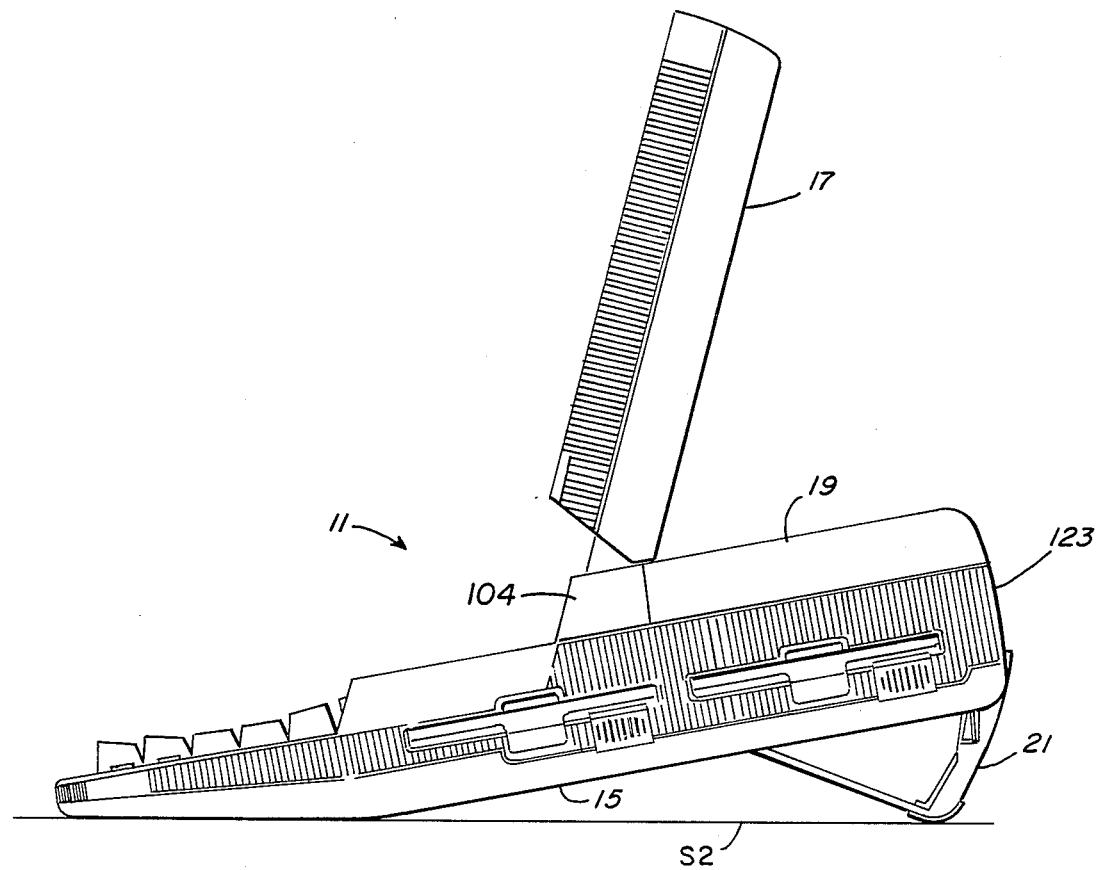
FIG. 5 is a right side view of the portable computer shown in FIG. 1, but with the foot dooe in an open position.
Figure 6:
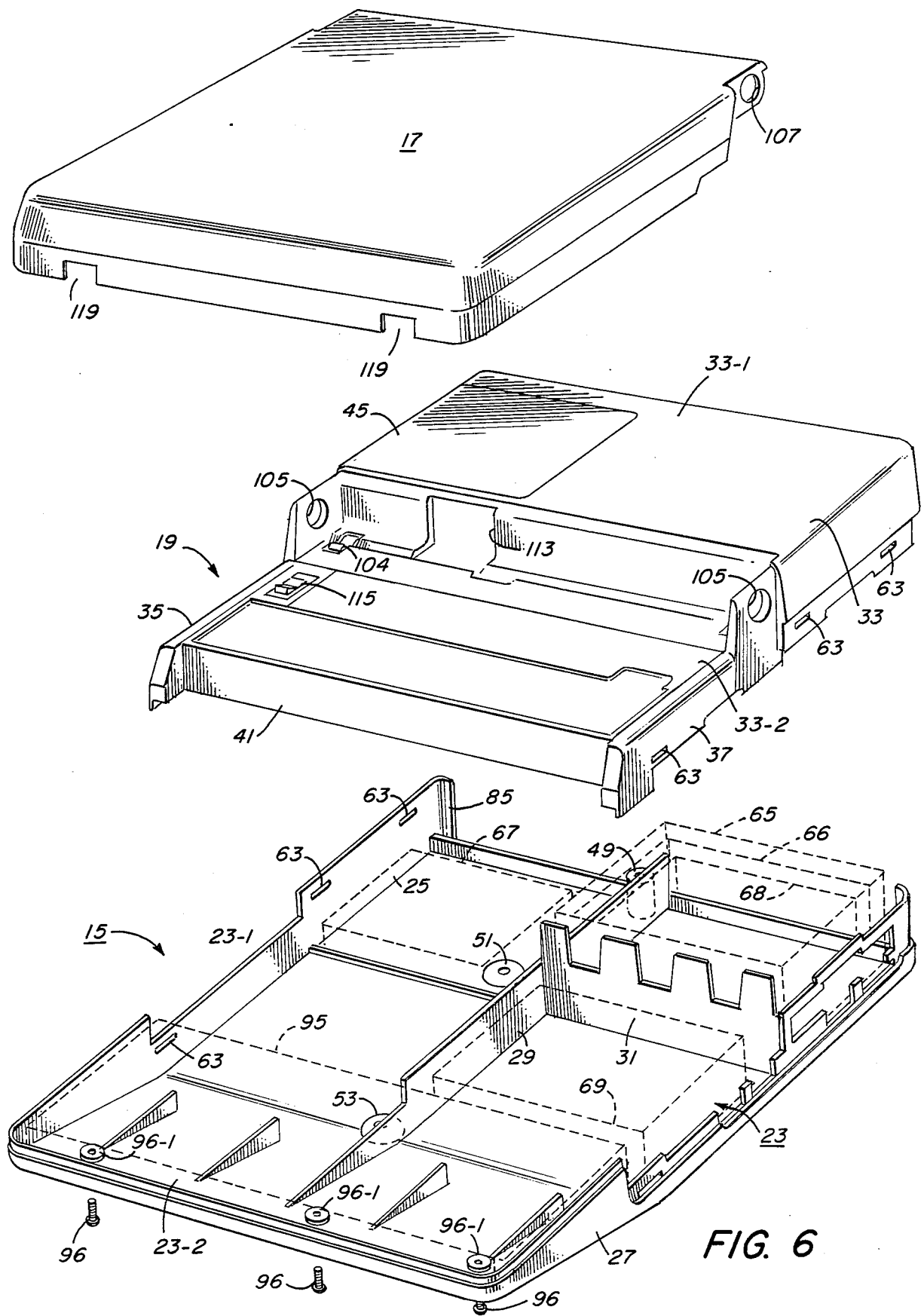
FIG. 6 is an exploded perspective view looking down, of the base, top rear cover and top front cover of the housing portion of the portable computer shown in FIG. 1.
Figure 7:
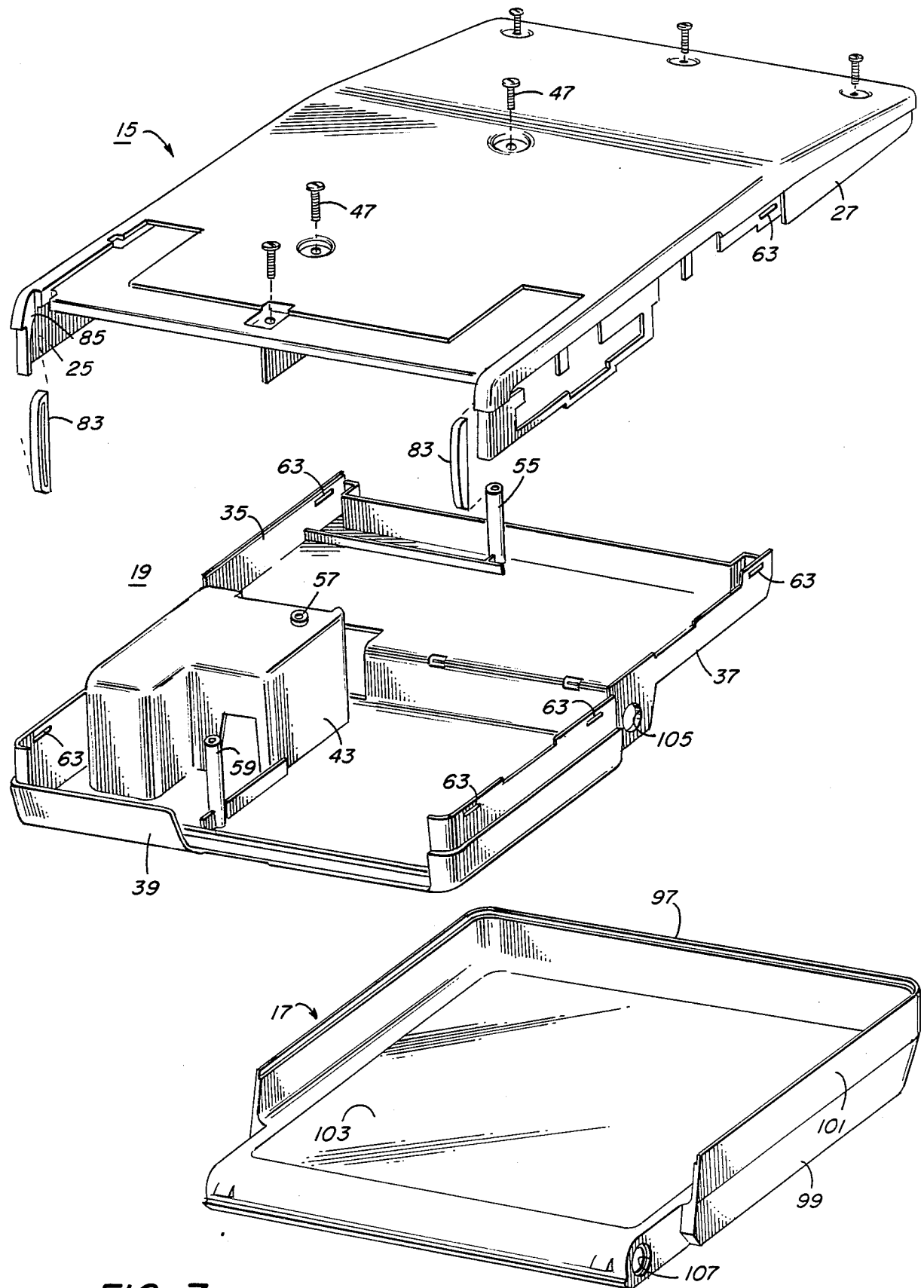
FIG. 7 is an exploded perspective view looking up, of the base, top rear cover and top front cover of the housing portion of the portable computer shown in FIG. 1.
Figure 8:
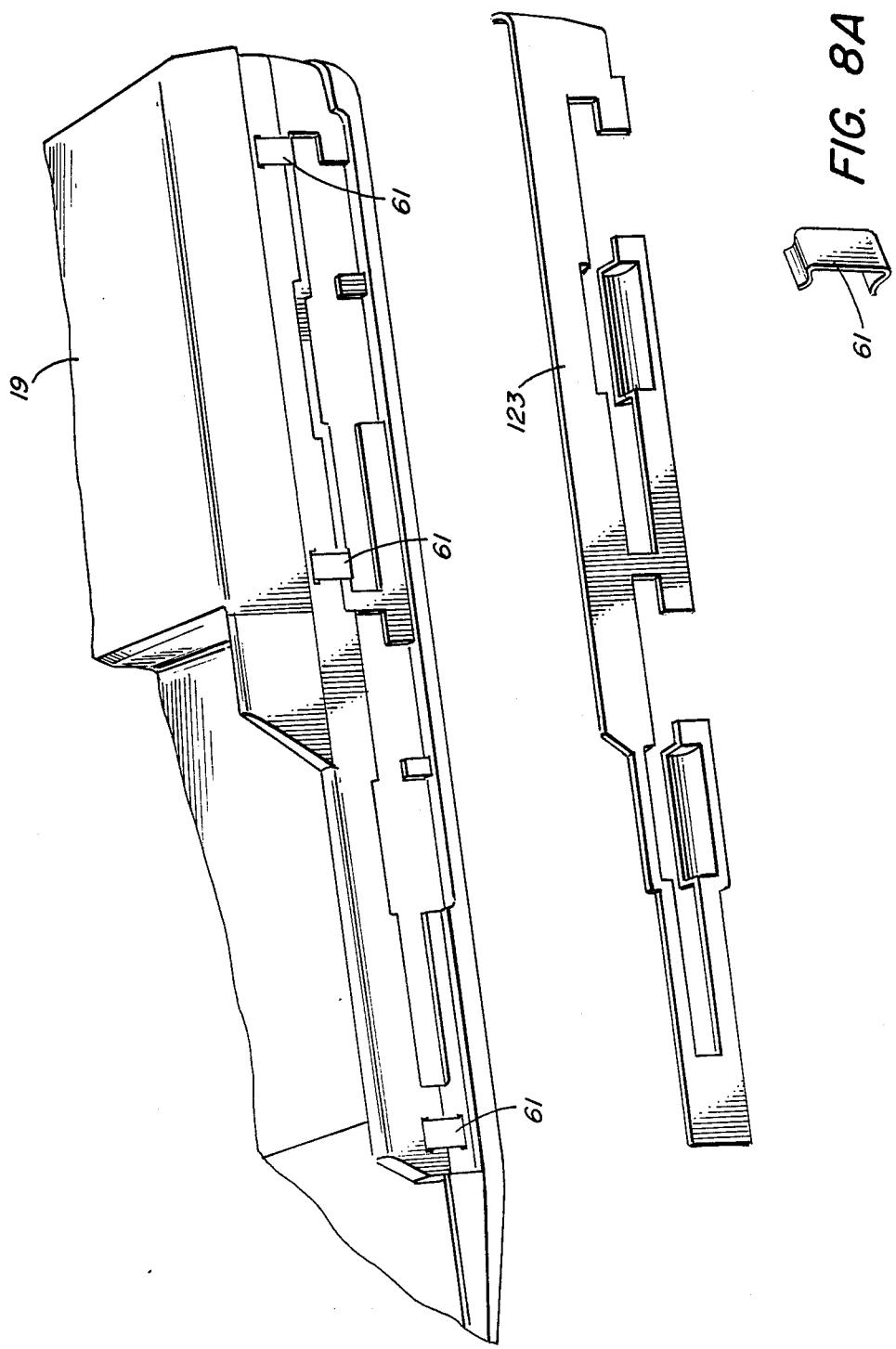
FIG. 8 is a perspective taken from the right and partly exploded of the portable computer shown in FIG. 4.

Foot door 21 is movabky mounted on base 15 with legs 81-1 and 81-2 extending into recessed areas 23-3 in bottom wall 23 and with guide pins 79-1 and 79-2 riding in channel elements 83. As so mounted, foot door 21 may be moved to either an open position (as shown in FIG. 5) or a closed position (as shown in FIG. 2). A pair of flex type locking tabs 85 or foot door 21 provide a positive type of locking when foot door 21 is in a closed position and detents 87 on channel elements 83 provide positive locking when foot door 21 is in an open position.

A flat generally rectangular metal plate or bulkhead 89 is disposed in base 15 behind center rib 29. Bulkhead 89 has a plurality of slots 91 in which are mounted various connectors 93-1, 93-2, etc. for use in connecting the electronics in portable computer 11 to external electrical devices (not shown) such as a modem or a main computer, etc.

A full size keyboard 95 is seated on the top surface of front section 23-2 of bottom wall 23 of base 15 and is fixedly secured thereto by means of three screws 96 which extend upward from the bottom of front section 21-2 into bosses 96-1. The back end of keyboard 95 extends partly into the chamber defined by base 15 and rear top cover 19.

Front top cover 17 includes a support 97 made up of a back plate 99 and a bezel 101. A full size (i.e. 80 columns by 25 lines) liquid crystal (LCD) display 103 is fixedly mounted on support 97. LCD display 103 includes a clear plastic protective plate 103-1. Front top cover 17 is pivotally mounted on rear top cover 19 by a pair of molded plastic pin elements 104 which extend through holes 105 formed in ears 107 on side walls 35 and 37 of rear top cover 19 and snap fit into holes 109 formed in support 97.

A set of batteries (not shown) for powering portable computer 11 are disposed in battery compartment 43.

LCD display 103 is electrically connected to the computer electronics inside the housing chamber by a cable 11, which extends down into the chamber of housing 13 through a slot 113 formed at the back of rear top cover 19. A switch 115 for turning portable computer on and off is fixedly mounted on rear top cover 19. Protective plate 101 includes a detent 117 which presses down in switch 115 and places it in the "off" position when top front cover 17 is place in a closed position. Latches 119 on the top front of top front cover 17 serve to top front cover 17 in a closed position.

Left and right trim plates 121 and 123 are also provided for portable computer 11. The trim plates 121 and 123 are snap fit onto the sides of housing 13 and held in place by detents 125. Right trim plate 123 is configured to allow disks to be inserted into the disk drive units in the chamber of housing 13.

Figure 4:
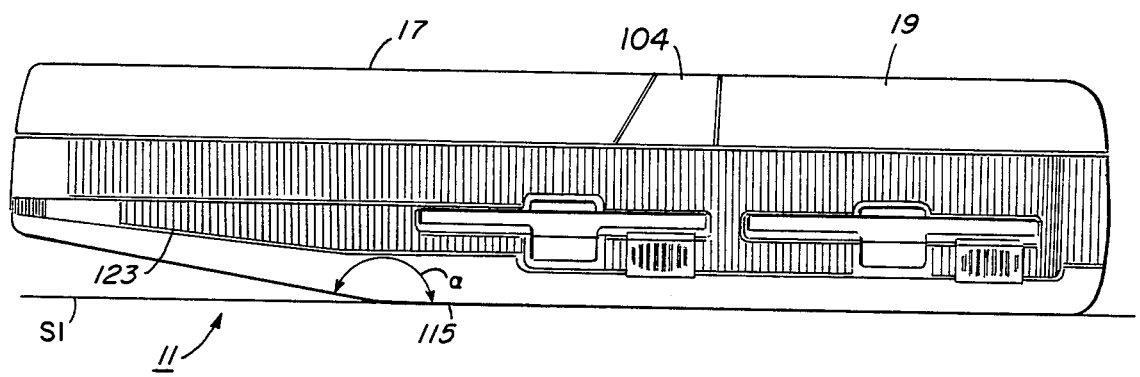
FIG. 4 is a right side view of the portable computer shown in FIG. 1, but with the front top cover closed.

Foot door 21 serves three purposes, namely, (1) serves as a cover to prevent damage to the connectors on bulkhead 89, (2) serves to provide a smooth surface for holding the portable computer 11 from the back end when it is being moved and (3) enables portable computer 11 to rest on a surface at either one of two different angles. More particularly, when foot door 21 is in a closed position back section 23-1 of bottom wall 23 rests on the surface on which computer 11 is placed (such as surface S1 in FIG. 4) while when foot door 21 is in an open position the front section 23-2 of bottom wall 23 and the bottom edge of foot door 23 rests on the surface on which computer 11 is placed (such as surface S2 in FIG. 5).

When computer 11 is on the lap of a user; the optimum angular position of the keys of keyboard 95 relative to the hands of the user is achieved with foot cover 21 in a closed position. On the other hand, when computer 11 is on a desk or table the optimum position of the keys of keyboard 95 relative to the hands of the user is achieved when foot door 21 is in an open position.

Front top cover 17 serves two purposes, namely (1) functions as a holder for LCD display 103 and (2) serves as a cover for keyboard 95. When front top cover 17 is flipped up in an open position (as shown in FIG. 1) the optimum viewing angle for LCD display 103 is between the viewing angle when foot door 21 is open and when foot door 21 is closed.

When front top cover 17 and foot door 21 are both in their closed positions, portable computer 11 has a rectangular wedge shaped configuration. Spring tabs 104 lock cover 17 in the open position.

An embodiment of the portable computer has been actually constructed wherein the overall size dimensions are about 11.7 inches by about 13.7 inches by about 2.8 inches and the weight is about 10.5 pounds. The keyboard is a low profile, non-encoded keyboard employing tactile feedback, conforming to ECMA guidelines, made by Fujitsu Corporation and having overall dimensions of around 290.5 mm. by 122.9 mm. by 19 mm. The LCD display is made by Epson Corporation and has overall dimensions of around 198 mm. by 270 mm. by 14 mm. The disk drive units are 3½ inch size diskette subsystems manufactured by Epson Corporation and having dimensions of around 101.6 mm. by 147.5 mm. by 32 mm. The battery pack contains ten NiCad D cells in a shrunk wrap package and is made by Matsushita Corporation.

The embodiment of the present invention is intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A portable computer comprising:
   a. a housing for resting on a surface, said housing including a base, a front top cover, a rear top cover and a foot door, said base including a bottom wall having a generally flat front section and a generally flat rear section, said generally flat front section being angled relative to said generally flat rear section, said rear top cover being secured to said base, said front top cover being pivotally mounted on said rear top cover, said foot door being mounted on said generally flat rear section and movable from a closed position to an open position for selectively tilting said housing in a forwardly direction, said computer being usable in both said tilted and said untilted positions and resting on said generally flat rear section of said bottom wall when in an untilted position and on said generally flat front section of said bottom wall and said front door when in a tilted position,
   b. computer electonic circuitry in said housing,
   c. disk drive means in said housing,
   d. a keyboard in said housing, and
   e. a display monitor in said housing.

2. The portable computer of claim 1 and wherein said keyboard is in an optimum position relative to the hands of a user on the one hand when said portable computer is on a desk and said foot door is in an open position and on the other hand when said portable computer is on the lap of a user and said foot door is in a closed position.

3. The portable computer of claim 2 and wherein said foot door is a unitary structure and includes a curved back wall and a bottom wall.

4. The portable computer of claim 3 and wherein said foot door includes means for providing positive locking of said foot door in a closed position and means providing positive locking of said foot door in an open position.

5. The portable computer of claim 4 and wherein said generally flat front section and said generally flat rear section are angled at an angle of about 10 degrees.

6. The portable computer of claim 5 wherein said means for providing positive locking of said foot door in a closed position comprises flex type locking tabs and said means for providing positive locking of said foot door in an open position comprises detents.

7. The portable computer of claim 6 and wherein said foot door serves as a cover for the back of the housing when in the closed position.

8. The housing of claim 5 and wherein said housing has a generally rectangular wedge shaped configuration when said foot door and said front top cover are both in their closed position.

9. The portable computer of claim 1 and wherein said display monitor is fixedly mounted on said front top cover.

10. The portable computer of claim 9 and wherein said display monitor includes a full screen liquid crystal display.

11. The portable computer of claim 10 and wherein said keyboard is a full size keyboard.

12. The portable computer of claim 11 and wherein said disk drive means comprises two disk drive units.

13. The portable computer of claim 12 and further including a battery pack removably mounted in said housing.

14. The portable computer of claim 13 and wherein said base, said rear top cover and said foot door are each unitary structures made of molded plastic.

15. The portable computer of claim 14 and wherein said front top cover includes a cover plate and a bezel.

16. A housing for a portable computer, said housing being constructed for resting on a surface and comprising a base, a front top cover, a rear top cover and a foot door, said base including a bottom wall having a generally flat front section and a generally flat rear section, said generally flat front section being angled relative to said generally flat rear section, said rear top cover being secured to said base, said front top cover being pivotally mounted on said rear top cover, said foot door being mounted on said generally flat rear section and movable from a closed position to an open position for selectively tilting said housing in a forwardly direction, said portable computer being usable in both said tilted and said untilted positions and resting on said generally flat rear section of said bottom wall when in an untilted position and on said generally flat front section of said bottom wall and said foot door when in a tilted position.

* * * * *